(12) United States Patent
Graf et al.

(10) Patent No.: US 6,765,829 B2
(45) Date of Patent: Jul. 20, 2004

(54) DEVICE HAVING A MEMORY ELEMENT, AND A MEMORY ELEMENT

(75) Inventors: Jens Graf, Gochsheim (DE); Martin Thomas, Kraichtal (DE); Axel Aue, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/075,851

(22) Filed: Feb. 13, 2002

(65) Prior Publication Data

US 2002/0126542 A1 Sep. 12, 2002

(30) Foreign Application Priority Data

Feb. 16, 2001 (DE) .......................................... 101 07 835

(51) Int. Cl.[7] .................................................. G11C 8/00
(52) U.S. Cl. .............. 365/189.07; 365/207; 365/230.06
(58) Field of Search ........................... 365/189.07, 207, 365/230.6

(56) References Cited

U.S. PATENT DOCUMENTS

| | | | | |
|---|---|---|---|---|
| 5,479,123 A | * | 12/1995 | Gist et al. ................... | 327/108 |
| 6,151,648 A | * | 11/2000 | Haq ........................... | 710/107 |
| 6,160,423 A | * | 12/2000 | Haq ........................... | 327/41 |
| 2002/0011998 A1 | * | 1/2002 | Tamura ...................... | 345/204 |

* cited by examiner

Primary Examiner—Michael S. Lebentritt
Assistant Examiner—Tuan T. Nguyen
(74) Attorney, Agent, or Firm—Kenyon & Kenyon

(57) ABSTRACT

A memory element and a device having a processor and a memory element, the memory element being positioned outside of the processor and being connectible to a processor via address and/or data lines, the address and/or data lines are each configured in an LVDS structure having corresponding drivers and receivers, and the drivers and receivers each being integrated in the memory element or in the processor.

6 Claims, 3 Drawing Sheets

DEVICE HAVING A MEMORY ELEMENT, AND A MEMORY ELEMENT

FIELD OF THE INVENTION

The present invention relates to a device having a processor and a memory element arranged outside the processor, as well as a memory element.

BACKGROUND INFORMATION

Control units for controlling operating sequences, specifically in a vehicle, are known. These are, for example, control units for controlling valve timing, brakes, transmission, etc. The digital components contained in the control units, in addition to the processor, or the computer, which contains an internal memory, also include external memories, which are connected via a printed-circuit board to the computer, or processor. Coupling the external memories to the processor is generally accomplished using a printed-circuit board. The connection via printed-circuit boards, however, represents a limitation on the working frequency of the coupling, because the latter represents both a capacitative as well as an inductive load. The efficiency of this connection, i.e., between the computer and the external memory, specifically the transmission rate, has a direct effect upon the overall efficiency of the system, in relation to the respective control system.

To achieve increased efficiency, modern connecting configurations such as in SDRAM (Synchronous Dynamic RAM) are known, which permit an increase in the frequency, albeit having the above-mentioned limitation. A further problem in the case of these connections is that they were developed for relatively long distances between computers and memories and therefore, within certain parameters, cannot achieve a higher frequency.

Further increases in the pulse frequency of the connection between the computer and the external memory are promised by technologies such as DDRRAM (Double Data Rate RAM), which are superimposed on the above-mentioned SDRAM, as well as RAMBUS technologies such as RDRAM (Rambus DRAM) or DRDRAM (Direct Rambus Dynamic RAM).

A further problem that arises in the context of increasing the connecting frequency is the radiation, i.e., the coupling of electromagnetic signals or energy, as a result of which, at higher pulse frequencies, greater expense is necessary in designing an adequate screening, in order to meet, for example, the legal requirements and also to prevent an undesirable coupling of signals.

However, it has been demonstrated that the related art has not been able to supply optimal results in every respect.

In addition, in another technical area, buses or bus systems are known as a point-to-point connections for the coupling of devices to a computer, which are represented in an LVDS (low voltage differential signal) structure. This LVDS structure is familiar as a standard in accordance with ANSI/TIA/EIA-644. According to this standard, LVDS acts as a communications connection, for example, between a computer and an associated video screen.

Furthermore, the IEEE standard P1596.3-1995 defines the aforementioned LVDS as a communications connection between processors in multi-processor systems, a point-to-point connection being represented here in half-duplex operation so as to be also bidirectional.

SUMMARY OF THE INVENTION

It is proposed to use the LVDS (low voltage differential signal) structure for coupling external memories to a processor, or computer. In this context, one initial result is the increased expense in comparison to conventional external memory connections, mainly because the number of leads per data bit is doubled from one to two. However, as a result, a significantly higher transmission rate is unexpectedly achieved in comparison to the conventional external memory connections, as a result of which this connection and therefore the entire system achieves greater efficiency. The result is a memory element which can be connected to a processor via address and/or data lines, the memory element being arranged outside the processor and the address and/or data lines being configured in each case in an LVDS structure using appropriate drivers and receivers, the drivers and receivers being integrated in the memory element.

Another result is a device having a processor and a memory element arranged outside the processor, the processor and the memory element being connected via address and/or data lines, and the address and/or data lines, in each case, being configured in an LVDS structure using corresponding drivers and receivers.

In addition to the increased efficiency, specifically in the transmission rate, the improved radiation protection with respect to signals, provided by the differential structure, can also be exploited in this context. Similarly, as a result of using smaller bus voltages, the radiation at the same pulse frequency is smaller due to the smaller signal deviation.

It is also advantageous that it is easier to adapt to new technologies as a result of the differential principle, because no power-supply dependency exists on the bus.

As a result of the parallel use of the LVDS structure, which is intrinsically provided as a point-to-point connection, the throughput over the connection between the computer and the external memory is substantially increased so that the computer, or processor, can adequately fetch, i.e., receive or retrieve, instructions even at higher pulse frequencies or transmission rates.

In this manner, systems, specifically control systems, for controlling operating sequences in a vehicle, can attain comparable efficiency from the external memory, in particular, from an external flash, such as heretofore has been possible only from the internal memory, specifically an internal flash. However, if in the case of the internal memory the advantage of higher efficiency, specifically the transmission rate, falls away, then for cost reasons, it is expedient to use only an external memory, specifically an external flash, which is linked by an LVDS structure to the computer, or processor.

It is also advantageous that the address information can be transmitted over this LVDS connection, and that therefore the efficiency, in particular the transmission rate, or the velocity, can be further increased, or the pin count for the bus interface can be raised.

DETAILED DESCRIPTION

Figure 1:
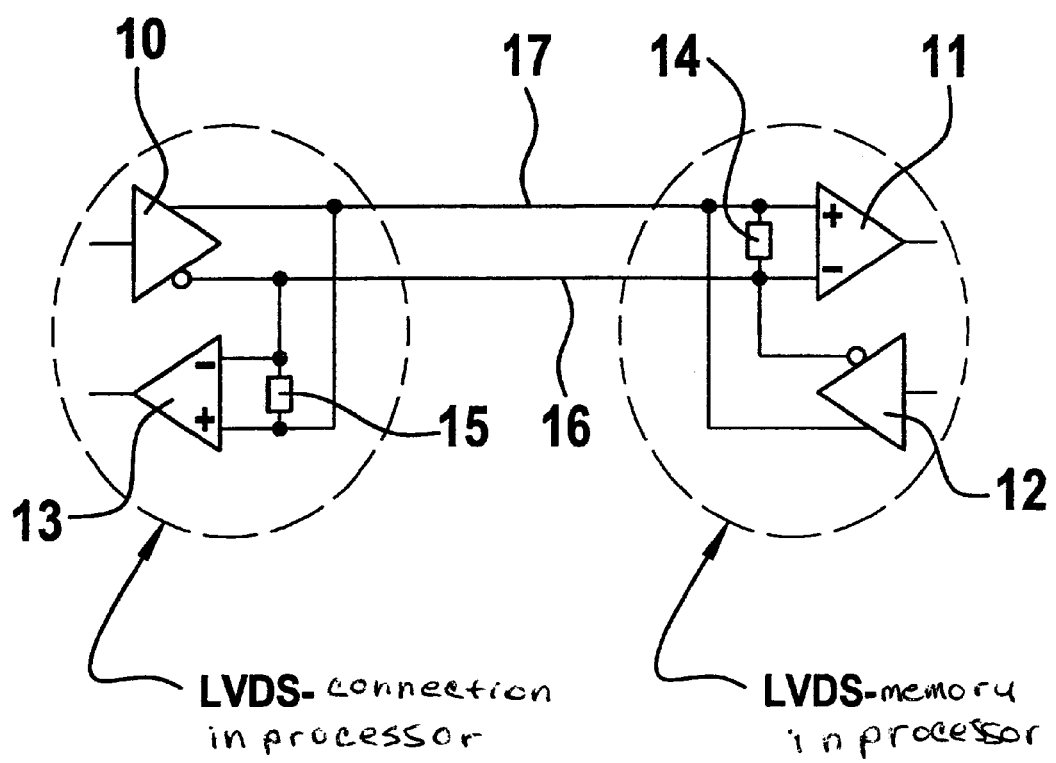
FIG. 1, in this context, depicts a bidirectional LVDS connection that can be operated in half-duplex, as it is used below.

FIG. 1 depicts as a point-to-point connection a bidirectional half-duplex transmission path in an LVDS structure.

In driver 10, a small voltage (e.g., 200 to 350 mV), which is generated by an undepicted power source, is released over terminating resistor 14 of the transmission path composed of two lines 16 and 17, the voltage being applied at the inputs of receiver 11. By reversing the direction of current in the driver component, a valid 0 or 1 information bit can be transmitted over the transmission path. To make possible bidirectional operation, a further driver 12 is connected on the receiver side, as is depicted in FIG. 1, and, on the driver side, a receiver 13, which for its part contains a terminating resistor 15, or upstream of which a terminating resistor 15 is connected. The depicted circuit arrangement therefore demonstrates a bidirectional half-duplex transmission path in LVDS technology, concrete reference being made to the standards cited in the introduction to the description, for a description of LVDS technology.

Indicated in FIG. 1 by dotted lines is the fact that the designated circuits, or circuit parts, are introduced according to the present invention in the computer, or processor, and in the memory, as depicted below for every bit line desired.

Figure 2:
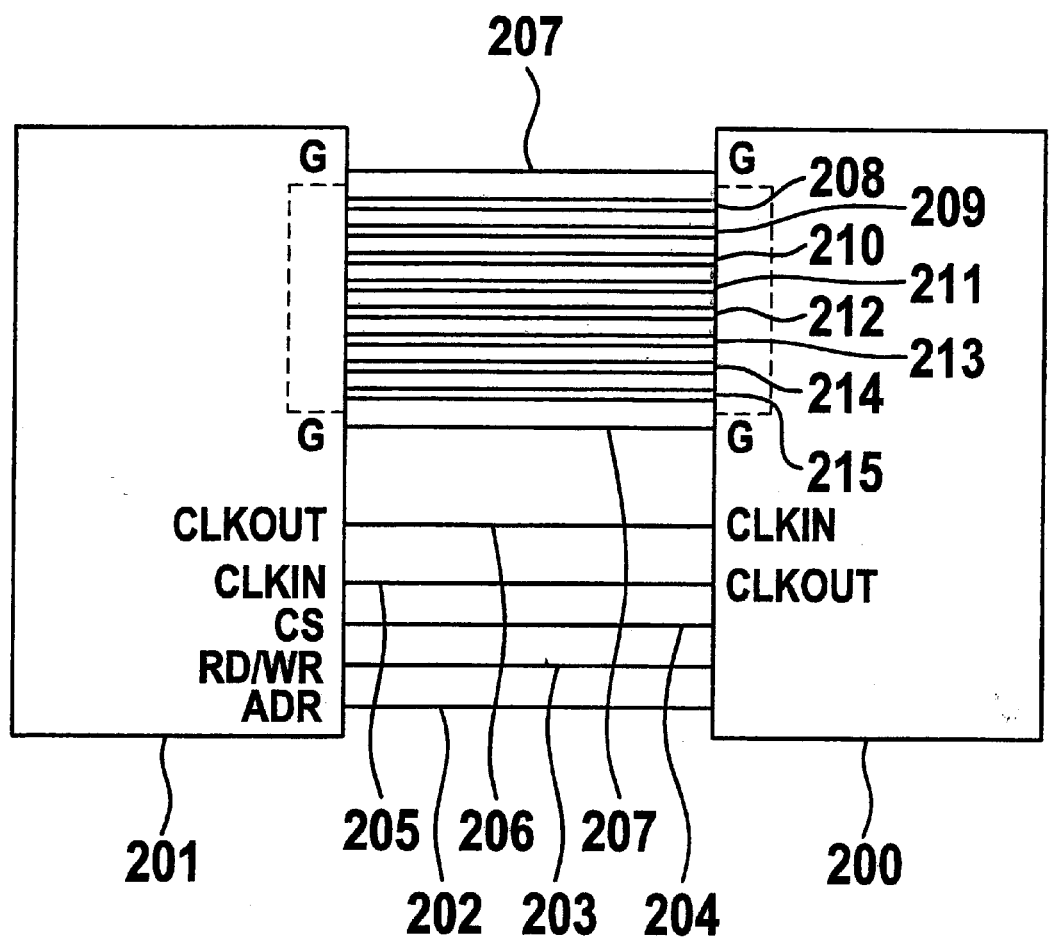
FIG. 2 depicts the coupling, according to the present invention, of an external memory to a computer, or processor.

FIG. 2 depicts a computer, or processor, 201 and a memory 200, which are connected to each other via various lines. For one thing, these are control signal lines 202 through 204, which include, for example, addresses ADR, write-read information bit RD/WR, and at least one chip selection signal CS. These bus control signals correspond to the control signals used in contemporary memory buses.

Furthermore, in 205 and 206 pulse signal lines are depicted, the respective inputs and outputs on the computer or memory being designated as clock-out and clock-in. In this context, the connections clock-in (CLKIN) and clock-out (CLKOUT) of the memory are used to eliminate the clock-skew, the bit skew.

Reference numeral 207 depicts ground line G (Ground), which is used as a screening.

Reference numerals 208 through 215 represent eight LVDS bit lines, each corresponding to the transmission path depicted in FIG. 1. In this way, a multiplexed 8-bit-address data bus can be represented, the eight data lines being formed by LVDS structures, or interfaces.

In this context, the present invention is not limited to the eight bit lines, for any other number of bit lines can also be used. For example, a system having 32 data lines and 24 address lines could be converted to 16-bit data in an LVDS structure. In transmitting the addresses on the data lines in half-duplex operation, i.e., as a multiplexed bus, this can take place even in a broader form. A comparison can explain this. In 32 data lines at a transmission frequency of 100 MHZ, 400 MB are transmitted per second. This is sufficient for a system frequency of 100 MHZ, but at 200 or 400 MHZ it would not suffice. If 16 data lines are used in a differential manner, i.e., in an LVDS structure, corresponding to 32 signal lines, this signifies that at a possible transmission rate of one GBit per data line, 16 GBit per second for the 16 data lines can be attained, as a result of which an efficiency, specifically the transmission rate of the bus, of 2 GByte per second can be attained.

As was already mentioned among the advantages, the address information can also be transmitted over the bus, and therefore either the pin count for the bus interface or the efficiency of the bus itself is increased. Using the above-mentioned bus interfaces, familiar in PC technology, a data rate of this magnitude cannot be achieved because the physical boundary conditions, set by the printed-circuit boards, do not permit this.

In the structure depicted in FIG. 2, in each case corresponding to receiver 11 and driver 12 and terminating resistor 14, these components, each in an LVDS bit line, are integrated in the memory, and the corresponding counterpart, having driver 10, receiver 13, and terminating resistor 15 for each of the bit lines, is integrated in the computer.

Figure 3:
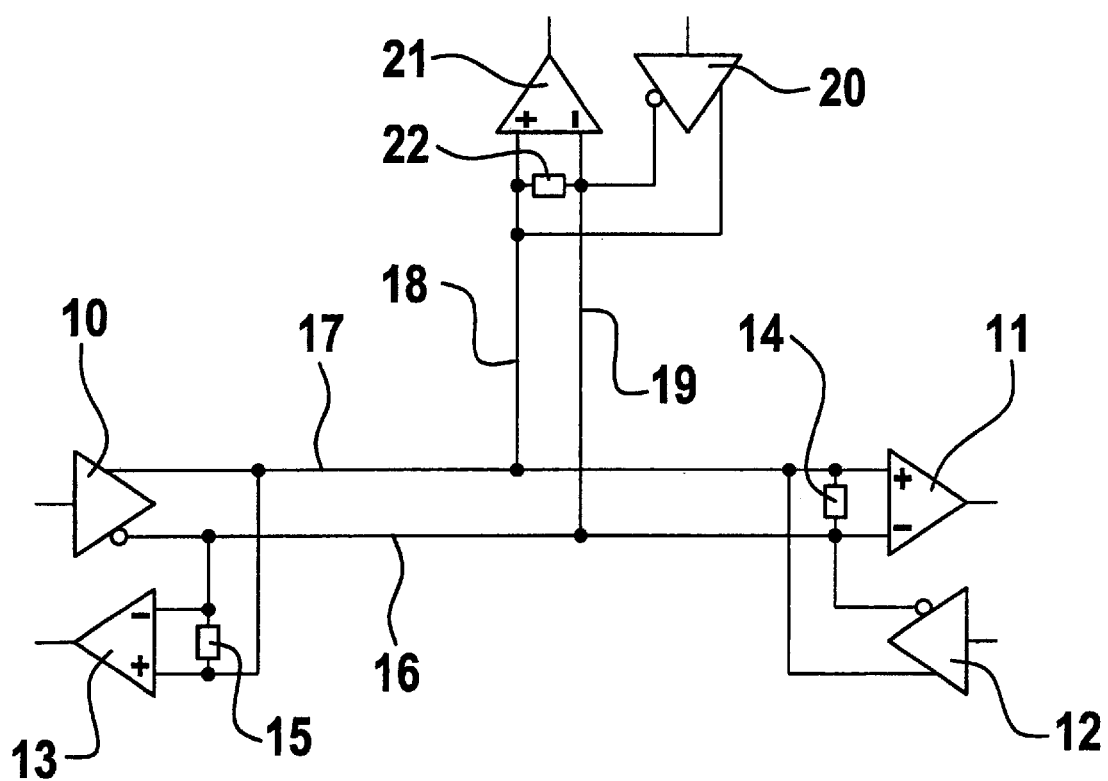
FIG. 3 describes the possibility of linking a plurality of external memories to the computer, or processor, using an LVDS structure.

In a further exemplary embodiment, FIG. 3 shows the linking of a plurality of external memories, or memory elements, using an LVDS structure, to a computer, or processor. In this context, once again drivers 10 and 12 as well as receivers 11 and 13 having corresponding terminating resistors 14 and 15 are depicted. In this context, the circuit, composed of driver 10, receiver 13, and terminating resistor 15, is for its part integrated in the computer, the circuit having receiver 11, driver 12, and terminating resistor 14 is integrated in a first memory element corresponding to FIG. 2. Lines 16 and 17 of the transmission path are now simultaneously coupled to lines 18 and 19, as a result of which a further transmission path is generated. This further transmission path for its part contains a receiver 21 as well as a driver 20 and a terminating resistor 22.

This LVDS circuit having receiver 21 and terminating resistor 22 as well as driver 20 is integrated in a second memory element. Thus by linking new LVDS circuits and therefore generating further transmission paths, additional memories, or memory elements of an external type, can be connected to the computer, or processor.

As a result of the efficiency generated in the structures described in FIGS. 1, 2, and 3 in linking external memories to a processor, it is possible entirely to do without internal memories in the computer, or processor. As a result, the initially increased expense due to the use of LVDS structures in linking external memories to the computer, or processors, can easily be compensated for, because an external memory, even in connection with an LVDS structure, is more cost-effective to realize than an internal memory.

What is claimed is:

1. A memory element that is connectible to a processor and that is positioned outside of the processor, comprising:
   at least one of address lines and data lines via which the memory element is connectible to the processor, each one of the at least one of address lines and data lines including an LVDS structure, each LVDS structure including a receiver and a driver integrated within the memory element.

2. A device, comprising:
   a processor; and
   a memory element positioned outside of the processor, wherein:
   the processor and the memory element are linked via at least one of address lines and data lines, and
   each one of the at least one of address lines and data lines includes an LVDS structure that includes a driver and a receiver, wherein the driver and the receiver are integrated within the memory element.

3. The memory element according to claim 1, wherein:
   only each of the data lines includes the LVDS structure.

4. The memory element according to claim 1, wherein:
   any number of the at least one of address lines and data lines in the LVDS structure are configured as bit lines.

5. The memory element according to claim 2, wherein:
   only each of the data lines includes the LVDS structure.

6. A device, comprising:
a processor; and
at least two memory elements positioned outside of the processor, wherein:
the processor and the at least two memory elements are linked via at least one of address lines and data lines,
each one of the processor and the at least two memory elements includes an LVDS structure, and
each LVDS structure includes a driver, a receiver, and a terminating resistor, wherein, for the LVDS structures included in the at least two memory elements, the driver, the receiver and the terminating resistor are integrated within the memory elements.

* * * * *